United States Patent [19]

Fredericks et al.

[11] Patent Number: 4,564,584

[45] Date of Patent: Jan. 14, 1986

[54] PHOTORESIST LIFT-OFF PROCESS FOR FABRICATING SEMICONDUCTOR DEVICES

[75] Inventors: Edward C. Fredericks, Haymarket; Harish N. Kotecha, Manassas, both of Va.

[73] Assignee: IBM Corporation, Armonk, N.Y.

[21] Appl. No.: 567,034

[22] Filed: Dec. 30, 1983

[51] Int. Cl.⁴ .......................... G03F 7/26; G03F 9/00
[52] U.S. Cl. ...................... 430/312; 430/22; 430/156; 430/315; 430/317; 430/318; 430/323; 430/324; 430/325; 430/326; 430/329
[58] Field of Search ............... 430/312, 22, 315, 325, 430/326, 324, 329, 156, 317, 318, 323

[56] References Cited

U.S. PATENT DOCUMENTS

| | | | |
|---|---|---|---|
| 3,827,908 | 8/1974 | Johnson | 430/191 |
| 4,104,070 | 8/1978 | Moritz et al. | 96/36 |
| 4,144,101 | 3/1979 | Rideout | 148/1.5 |
| 4,218,532 | 8/1980 | Dunkleberger | 430/324 |
| 4,376,658 | 3/1983 | Sigusch | 430/312 |
| 4,378,383 | 3/1983 | Moritz | 427/96 |
| 4,379,833 | 4/1983 | Canavello et al. | 430/326 |
| 4,434,224 | 2/1984 | Yoshikawa et al. | 430/326 |

FOREIGN PATENT DOCUMENTS

54-08467 1/1979 Japan ........................... 430/312

OTHER PUBLICATIONS

Havas, J. et al., *IBM Tech. Discl. Bulletin*, vol. 21, No. 6, pp. 2306-2308, 11/1978.
Romankiu et al., *IBM Tech. Discl. Bulletin*, vol. 18, No. 12, pp. 4219-4221, 5/1976.
IBM TDB, vol. 24, No. 10, p. 5063, entitled "Image Reversal Lift Off Process" by C. J. Hamel et al., Mar. 1982.
IMB TDB, vol. 23, No. 4, p. 1368, entitled "Electron-Beam-Exposed Positive Photoresist Providing Image . . . " by Reagan, Sep. 1980.
IEEE, vol. EDL-1, No. 10, Oct. 1980 entitled "A High Resolution Negative Electron Resist by Image Reversal" by Oldham et al.

*Primary Examiner*—Charles L. Bowers, Jr.
*Attorney, Agent, or Firm*—Jesse L. Abzug; John E. Hoel; Maurice H. Klitzman

[57] ABSTRACT

A method making self-aligned semiconductors utilizing two resist masking steps to form a device; making one of the masks insoluable with respect to the other so that when a first part of the device is formed by a first mask, and a second part of the device is formed by the second masks, the parts are self-aligned when the first resist is dissolved.

3 Claims, 17 Drawing Figures

↓
BAKE
↓
EXPOSE, DEVELOP & ION IMPLANT

↓
OXIDIZING PROCESS
↓
RINSE, DRY
↓
SECOND PHOTORESIST WITH IMIDAZOLE (IMAGE REVERSAL)

↓
BAKE, EXPOSE, LIFT-OFF
↓

PHOTORESIST LIFT-OFF PROCESS FOR FABRICATING SEMICONDUCTOR DEVICES

DESCRIPTION

1. Field of the Invention

This invention relates to a photoresist lift-off process and more particularly to a photoresist process for obtaining self-alignment between adjacent regions of a submicron semiconductor.

2. Background of the Invention

As the dimensions of semiconductor integrated chips become smaller so as to increase density and decrease circuit switching time between devices on a chip, alignment of via holes and accurately placing devices on chips becomes critical in order to prevent electrical shorts.

When fabricating semiconductor integrated circuit chips, resist technology plays a primary role in transferring mask patterns onto a semiconductor substrate. The present day integrated circuit fabrication technologies are complex and involve a large number of such masking steps. The degree of alignment achieved between these masking steps dictates the density of circuits and the circuit performance that can be achieved. Furthermore, the larger the number of masking steps utilized, the larger is the potential for misalignment.

In utilizing present day photoresist technology to make contact from one layer to another for micro density designs, misalignment results when exposing and developing photoresist on small critical contact areas. This misalignment occurs because multi overlays of different levels of masking contain overlay errors due to use of mechanical tools like an exposure tool and slight differences between the masks themselves. For example, in the case of depositing a metal contact to a diffusion, the alignment between the contact to the diffusion edge can result in unacceptable device electrical characteristics.

In MOSFET metal gate technology very large undesirable MOSFET gate to diffusion capacitance is produced. This problem was improved with the introduction of the self-aligned polysilicon gate technology. However, with increase in density self-alignment becomes even more critical because misalignment contributes even more to unwanted increased capacitance.

In CMOS processes such as that described in U.S. patent application Ser. No. 490,766, filed May 2, 1983, now U.S. Pat. No. 4,471,523, and assigned to the present assignee, self-alignment between the field ion implant and both the n-well and the nMOSFET is most desirable so that density is improved and the doping profiles are optimized to reduce the well known latch-up problem. The sequential process steps disclosed in that application are (1) photolithography, (2) ion implanting, (3) depositing silicides or silicon into the area implanted and performing lift-off, (4) field implanting a second time on the whole wafer and, (5) employing additional masking steps.

Although the above process produces improved self-alignment, an overlay error still exists because it is impossible to remove all of the mask errors, wafer warpage, and tool errors that, when combined, these errors become unacceptable to the smaller micron density devices. In sum, although the prior art nearly achieves alignment for larger density chips, they still can not achieve self-alignment for submicron chips.

One effort to solve the overlay error problem has been by increasing the accuracy of overlaying of subsequent masking levels by the operator using better exposure tools and using better operators. For example, rather than aligning the substrate as a whole with a mask, efforts have been made to align each chip to a chip location on a mask. When dealing with submicron technology, the improvements have not been completely satisfactory. Mechanical tools such as an exposure tool have inherent errors simply because the machine has moving parts. However, no matter how much effort is applied in seeking alignment, it is almost impossible to achieve the accuracy needed for submicron technology using existing mechanical tools and masks.

Another prior art method of attempting to obtain self-alignment is by image reversal of photoresist patterns. One such example is described by Oldham and Hieke in their paper entitled "A High Resolution Negative Electron Resist by Image Reversal", published in Electron Device Letters, Vol. EDL-1, No. 10, October 1980. It describes the use of flood UV exposure on patterns formed using AZ 1350 family photoresist to obtain high resolution image reversal patterns. Another such example is in U.S. Pat. No. 4,378,383, issued Mar. 29, 1983, and assigned to the same assignee as this application. These prior art attempts to obtain self-alignment use image reversal to build overhangs in the photoresist sidewalls. These overhangs are desirable to enable efficient lift-off for metal interconnects or contacts. Additional reverse image examples are found in U.S. Pat. No. 4,104,070, issued Aug. 1978; an article in the IBM Technical Disclosure Bulletin by B. M. Raegan, entitled "Electron-Beam-Exposed Photo-resist Providing Image Reversal", Vol. 23, No. 4, September 1980; and an article in the IBM Technical Disclosure Bulletin by Hamel, et al., entitled "Image Reversal Lift-Off Process", Vol. 24, No. 10, 1982.

All the above photoresist image reversal processes have been developed with the purpose of reversing pattern features and producing overhangs on the photoresist window sidewalls to do metal lift-off. None of the above techniques allow a process such as etching or ion-implantation to be carried out before the image reversal takes place. Thus, the self-alignment between adjacent regions processed differently is not possible with the aforementioned prior art. They, therefore, have unacceptable overlay error for submicron devices in aligning via holes, devices and circuit lines.

U.S. Pat. No. 4,144,101, issued March 13, 1979, and assigned to the same assignee as this application, discloses another method of obtaining self-alignment. Although the self-alignment feature is satisfactory for its purposes it doesn't do away with the overlay error because the method of depositing the metal inherently results in angular diffusion on the sidewalls of the metal. The angular sidewall results because of inability to accurately control the developed photoresist profile necessary to achieve lift-off, because of the reflectivity differences in the substrate, and because of the design of metal deposition tooling. Further, the second masking layer is not photoresist, but lifted-off material such as aluminum. This lift-off process tends to compound the overlay error even more, because of the angular deposition problems and resist profile differences prior to deposition. This requires extensive steps to obtain self-alignment.

OBJECTS OF THE INVENTION

It is therefore an object of this invention to substantially eliminate overlay error in an improved manner.

It is another object of the invention to eliminate some of the masking steps heretofore employed to aid in reducing the overall overlay error.

It is a further object of the present invention to provide an improved photoresist process so that two adjacent regions processed differently are self-aligned and require fewer number of fabrication steps than prior attempts.

It is a still further object of the present invention to reduce the number of masking steps in MOSFET technologies requiring more than one threshold voltage ion-implant.

It is still another further object of the present invention to significantly improve self-alignment over other known methods.

SUMMARY OF THE INVENTION

A photoresist lift-off process is disclosed for use in fabricating submicron semiconductor devices. A first layer of positive photoresist is applied to the surface of the semiconductor. A photomask having a pattern of apertures shaped in the same way as the pattern of holes to be formed in the positive photoresist layer, is placed between the photoresist coated semiconductor wafer and a source of light. Wherever light projects through the apertures of the mask and strikes the positive photoresist layer, the positive photoresist becomes more soluble, whereas those portions of the positive photoresist layer which are effectively masked from the light source remain relatively insoluble.

The photoresist coated semiconductor wafer is then dipped in a solvent which removes those portions of the positive photoresist layer which were exposed to the light source through the mask. The resultant first layer of photoresist thus developed has a pattern of apertures therein identical to the pattern of apertures in the mask. Any one of a number of subsequent steps such as ion implanting, etching, or deposition, can be carried out through the apertures in the first photoresist layer.

Thereafter, a second photoresist layer containing imidazole (as described in U.S. Pat. No. 4,104,070 to Moritz and Paal and assigned to the same assignee as this application) is coated over the entire structure, the second photoresist layer having a negative exposure quality such that wherever the second photoresist layer is exposed to light, it becomes still more resistant to dissolving. The entire structure is then exposed to light without benefit of a second mask. Since the second photoresist layer is at least translucent to the light source, those remaining portions of the first layer of positive photoresist will become soft and soluble. In the apertures of the first layer of positive photoresist where the silicon semiconductor substrate was exposed, the second layer of negative photoresist firmly adheres to the silicon surface and by virtue of the second blanket optical exposure, is hardened to subsequent dissolution. Those portions of the second layer of negative photoresist which lie upon the optically softened remaining portions of the first layer of positive photoresist, are relatively easy to remove by mechanically lifting them off during a subsequent emerging of the entire structure in a suitable solvent. After the application of the second solvent, only the second layer of negative photoresist remains and it occupies those portions of the semiconductor surface which were originally exposed through the apertures of the first layer of positive photoresist. Thus, overlay error has been minimized since there has been a complete, mutually self-aligned, image reversal of the patterns of the first layer of positive photoresist and the second layer of negative photoresist. The apertures in the second layer of negative photoresist are those regions which were originally covered and protected by the first layer of positive photoresist. Any one of a number of subsequent semiconductor processing steps such as ion implanting, etching or deposition, can be carried out through the resultant apertures in the second layer of negative photoresist.

The foregoing and other objects, features and advantages of the invention will become more apparent when read in light of the following description and drawings:

GENERAL DESCRIPTION OF THE PREFERRED EMBODIMENT

Referring to FIGS. 1A through 1D, illustrated in general, is the coating exposure and development of a first photoresist (PR), a process such as ion implantation then takes place followed by an oxidation treatment of the first photoresist, coating of the second photoresist follows and concluding with subsequent bake, expose and lift-off processes.

Figure 1A:
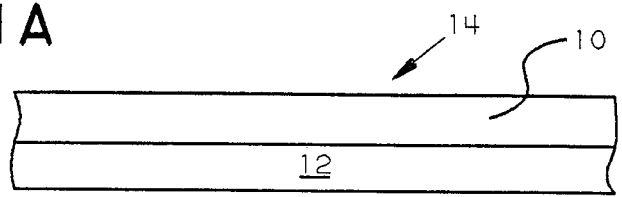
FIGS. 1A-1D are cross-sectional views showing fabrication of a CMOS semiconductor device in various stages of employing photoresist in accordance with the invention.
Figure 1B:
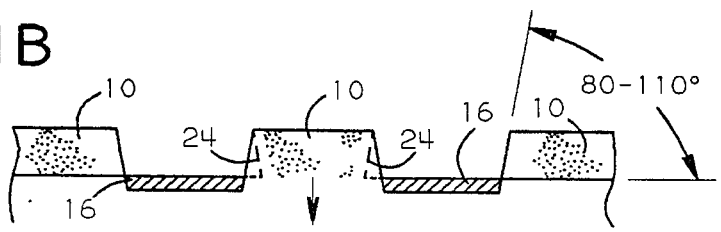
Figure 1C:
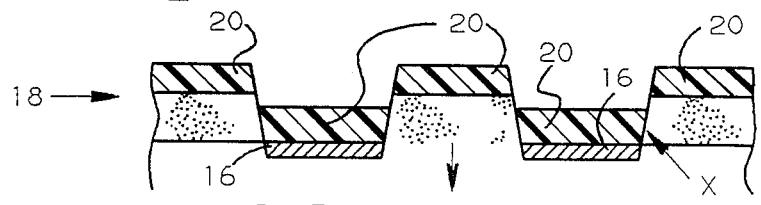
Figure 1D:
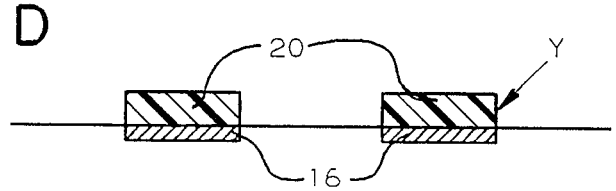

More specifically, but still generally, the first PR lift-off (L/O) process allows a first process such as, ion implantation, etching or deposition, to be carried out on a selected region of the silicon wafer. After PR L/O is carried out, a second process such as, ion implantation, etching, or deposition, is next carried out in the remaining regions of the wafer in a self-aligned manner. Briefly, this is accomplished by first patterning the wafer with a first photoresist 10 on substrate 12. The wafer 14 now undergoes an ion implant, or etch or deposition followed by an oxidizing treatment step so as to provide an anti-adhesive quality between the layers of photoresist. Next, a second photoresist 20 is coated on the wafer, baked and flood exposed as shown in FIG. 1C. Lift-off now takes place so that the regions where the first process was done are now masked out by the presence of photoresist 20 as shown in FIG. 1D.

In the broadest process steps of the invention, included are the steps of:

A. A First Resist 10
 1. Surface preparation by cleaning and the like
 2. Apply and bake the first resist
 3. Expose the first resist
 4. Develop the first resist
B. A Second Resist 20

1. Apply and bake the second resist
2. Bake the second resist
3. Lift-off the second resist

DETAILED DESCRIPTION OF THE PREFERRED EMBODIMENT

The following is a more detailed description of the preferred embodiment of the invention.

A. A First Photo-resist 10

1. Surface preparation

After the wafers have been cleaned in the state-of-the-art manner before the photoresist is layered, an adhesion promotor is applied. A suitable adhesion promotor is 1:8 ratio of HMDS-Freon vapor. The application time may range from 1-4 minutes.

2. Applying first photoresist

Photo-resist 10 is one of several available in the state-of-the-art, for example, AZ1350J, AZ4110, etc. made by the Azo Plate Corporation. The thickness of the resist may vary from 1.0 um to 3.0 um. A normal bake at 85 to 95 degrees centigrade for 10 to 30 minutes follows to drive out solvents from the first PR 10.

3. Exposing first photoresist

The pattern to be printed is exposed using a state-of-the-art photolithographic exposure tool. The exposure is done using actinic radiation in the wavelength range between 300-600 nm with a radiation dose optimized to produce 80 to 90 degrees angle sidewalls on the exposed patterns as shown at 22 in FIG. 1B. Typically, the radiation does lies in between 50 to 150 mj/cm2. Although photoresist has been described, it is not the only type of energy that can be used to affect preferential solubility in critical areas. For example, electron beams, programmable electron beams or ion beam exposure tools or X-ray exposure with suitable masks can also be used.

It has been discovered that if the sidewalls of the first photoresist is less than 80°, the solvent can not readily dissolve the first photoresist and effect a clean lift-off. Also, if the sidewalls are undercut, for example, more than 110° as shown in dotted lines at 24, the developed images will have an insufficient base to support the developed first photoresist. Thus, any angle from 80° to 110° is the most efficient operating range, with a 90° angle being preferred. The photolithographic steps for achieving the desired sidewall angles are accomplished by controlling the exposure dose and development conditions.

Thus, as a normal consequence of the second photoresist processing, the sidewall angle Y of the lifted off second photoresist, FIG. 1D, is complementary to the sidewall angle X of the first photoresist as illustrated in FIG. 1C. The total of X and Y, therefore, is 180°.

4. Developing the first photoresist

Development of the first photoresist is carried out in an aqueous alkaline developer such as KOH or NaOH at 10 to 20 degrees centigrade. Typical strength of the developer is 0.16 to 0.25N. It is well known that sodium in integrated circuit processing can cause ionic contamination resulting in device failure. Thus, KOH is preferred since sodium content is eliminated.

The next step is deionized (DI) water rinse (10 to 14 megaohms) followed by centrifuge or blow dry of the rinsed water.

The wafers are now ready to carry out one type of processing. This part of the process is only intended as illustrative of the kind of process that can be performed at this stage and forms no part of the invention. This may include etching or ion-implantation. It is important that care be exercised not to over heat since the photoresist patterns can be damaged. Thin film deposition may be used so long as the film is relatively thin compared with the second PR 20. In this case, depending on the type of film, the subsequent oxidation process may not be necessary.

Once the above process is performed, followed by adequate cleaning steps, the wafers are ready for the second PR 20 application.

B. Second Photo-resist

1. Oxidizing Treatment

In preparing the wafer for a second photoresist coating, the wafers are soaked in an oxidizing chemical solution such as potassium permanganate (5-10%) or chromic acid (10%) for 2 to 10 minutes followed by DI water rinse and subsequent dry.

An optional bake at 80 to 100 degrees centigrade for 5 to 30 minutes may be used to remove residual water.

An important step in the invention process is that an oxidized surface 18 be disposed between the first PR and the second PR to prevent adherence to one another so that complete lift-off of the first and second PR stacked regions is possible. There are alternate ways to the oxidizing chemical to provide for ease of separation. For example, the surface of the first PR may be treated with a $CF_4$ plasma at low pressure and power for up to 1 minute as is well known in the art.

2. Applying the second photoresist

The second PR can be of the same formulation as the first. The only difference is that an additive such as imidazole is added to make the second PR relatively insoluble compared to the first PR. Due to this solubility difference, the first PR remains soluble enabling the second PR to be lifted off later in the process.

The amount of imidazole in the second PR is in a concentration of between 1 to 5% by weight. The thickness of the second PR ranges from 0.5 to 1.5 um, and may be applied using state-of-the-art spinners.

3. Baking the second photoresist

An oven or hot plate bake at 95 to 110 degrees centigrade for 10 to 30 minutes is used to dry the second PR.

4. Exposing the second photoresist

The second PR is now blanket exposed in ultra violet light of wave length between 300 to 600 nm and dose of 400 to 2000 mJ/cm2. The purpose here is to cross-link the second PR to make it insoluble compared to the first PR.

5. Lift-Off of the second PR

To carry out lift-off, the wafers are soaked in an alkaline solution such as 0.05 to 0.10N.KOH, NaOH or sodium metasilicate solution for 1 to 5 minutes followed by a strong deionized (DI) water rinse. This is repeated as required until lift-off is completed.

The wafers are now rinsed and dried in the normal fashion and are ready for a second series of state-of-the-art processing steps, adjacent to where the first series of processing steps took place.

APPLICATION OF THE PREFERRED EMBODIMENT

A large number of potential applications of the two step photoresist process are possible with resulting improved process and cost savings due to eliminating a mask step and doing away with metal and accompanying expensive tools needed for its fabrication. Such illustrative applications include processing steps for MOSFET technology and bi-polar technologies.

As was mentioned earlier, the normal state-of-the-art processing steps prior to the first photoresist layer and after lift-off of the second photoresist layer is ion-implantation. However, etching or deposition may be employed. For purposes of demonstrating how the invention is applied the following are two state-of-the-art applications where these processing steps may be used. These examples are only intended to be illustrative.

A. MOSFET Threshold Voltage Tailoring Ion-Implantation

In the present state-of-the-art self-aligned polysilicon gate MOSFET technologies, the two extensively used ion-implant steps are threshold voltage ion-implants to build enhancement mode or depletion mode devices. For CMOS technology, two ion-implants are also required to adjust the threshold voltage of pMOS and nMOS devices. Typically, two masking steps are used to better control the device threshold voltages. If the pMOS devices are masked followed by a nMOS threshold ion-implant, the second masking step is used to mask out the nMOS devices, and ion-implant the pMOS devices with a different dose and energy.

Figure 2A:
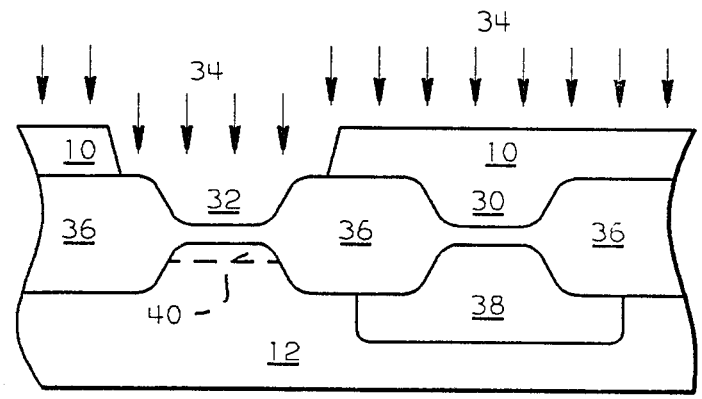
FIGS. 2A-2B are cross-sectional views of a CMOS semiconductor device employing ion implantation in the field area.

Referring to FIG. 2A, the photoresist lift-off process of this invention is performed in the following manner. After the first PR 10 is patterned (to mask out the pMOS device region 30), the nMOS 32 device threshold voltage tailoring ion-implant 34 takes place. Following the photoresist lift-off, nMOS devices 32 are masked out. The pMOS 30 threshold voltage ion-implant is next applied. Since the ion-implantation energy is typically low, the implant does not have any adverse effects on the field insulation regions 36.

As shown in FIG. 2A, for a typical CMOS structure application, prior to nMOS device threshold voltage ion-implantation the first photoresist 10 is exposed to open only the nMOS device regions 32. Both the pMOS device regions 30 and the field insulator regions 36 are covered by the first photoresist 10. The pMOS device 30 is subsequently built in the n-well region 38, formed in the semiconductor substrate 12. NMOS threshold voltage tailoring ion-implant 34 is carried out to selectively place the implanted impurities in the channel region 40 of the nMOS device 32.

Next, the photoresist 10 is lifted out in the aforementioned manner as described in the section on lift-off.

Figure 2B:
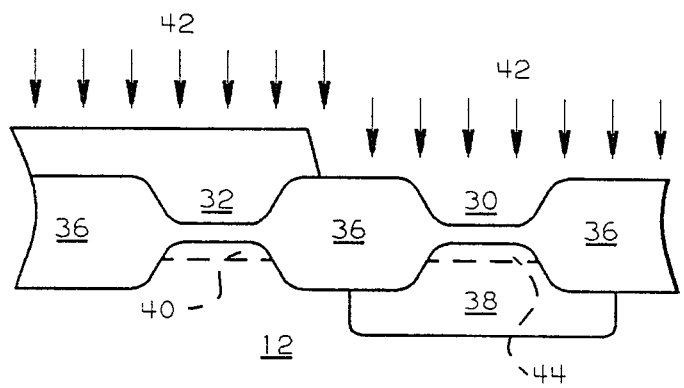

Now, referring to FIG. 2B, the second photoresist now covers only the nMOS device region 32. The pMOS threshold voltage adjust ion-implantation 42 implants appropriate impurities in the channel region 44 of the pMOS device region 30. Since the ion-implant energies are typically low, the effect on the field region 36 is inconsequential.

B. Fully Self-Aligned CMOS Process

An important sequence in present n-well CMOS processes is that n-well drive-in supersede field insulator growth. The reason is n-well drive-in occurs at high temperatures, i.e., in excess of 1000 centigrade, and if the field insulator is subjected to such heat treatment, its threshold voltage reliability is significantly degraded resulting in excessive leakage currents that cause the circuits to fail. By the same token, the p-field region ion-implantation must follow the n-well drive-in, otherwise the heat treatment will diffuse out the implanted impurities to an extent that the field insulator threshold voltage value will be very low.

From the foregoing discussion, present practice employs an optimal n-well CMOS process sequence by, (1) n-well ion-implantation followed by drive-in, (2) nMOS and n-well region masking followed by p-field ionimplantation, and (3) field region insulator growth.

A key problem encountered in present CMOS fabrication is that of alignment of the field ion-implant to the n-well and the nMOS device regions. If the implanted dopants penetrate either of these two regions, the device characteristics are degraded causing the circuits not to function. This problem of alignment arises primarily because two separate masking steps are required to form the n-well and the device regions.

The prior art has attempted to solve the alignment problem, by selectively masking out the n-well regions with an insulating material that subsequently can be easily removed. The insulating material is thick enough to inhibit the penetration of the p-field region ion-implant in the n-well. A state-of-the-art process, attempts to achieve alignment by depositing evaporated silicon of sufficient thickness on top of the n-well immediately following the n-well ion-implantation. The excess evaporated silicon is then lifted off while the photoresist is stripped. The second masking level defines the pMOS and the nMOS device regions. At this point, p-field region ion-implantation is carried out. No dopant penetrates either the n-well or the nMOS device regions since the former is covered by evaporated silicon and the later by the masking photoresist.

Some of the key problems associated with the state-of-the-art process relate to silicon lift-off. First, due to the intrinsic stress in the silicon, the evaporated silicon tends to crack whereby the image control is very poor. Secondly, it has been found that the thickness of the evaporated silicon is very hard to control, thus the lift-off may leave problems such as fencing and bridging between lines. The third problem relates to the fact that since the silicon is evaporated in the presence of photoresist, due to temperature variations in the evaporator, the photoresist may be subsequently hard to remove. Even in that instance there is a possibility that the photoresist may reflow thereby completely or partially blocking the exposed patterns. A forth problem often encountered is that the relatively high heat treatment during n-well drive in alters the material composition of silicon, and etching and removal becomes an extremely difficult task.

Lastly, this process is relatively expensive. The n-well photolithography is complex. It requires image reversal as typically used for lift-off which is composed of an extensive number of process steps. Further, the through-put from the evaporator is relatively low, and therefore costly.

These problems and others are overcome when our photoresist lift-off process invention is incorporated in the CMOS process as described next.

Referring to FIGS. 3A–3F, incorporation of the photoresist lift-off process in CMOS technology is illustrated.

Figure 3A:
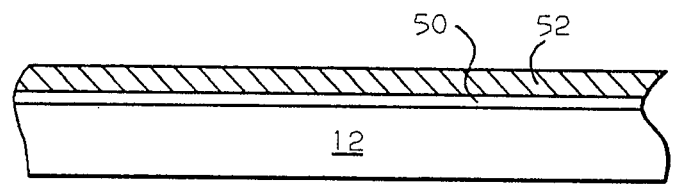
FIGS. 3A-3F are cross-sectional views showing fabrication of a CMOS semiconductor device for n-well ion implantation.
Figure 3B:
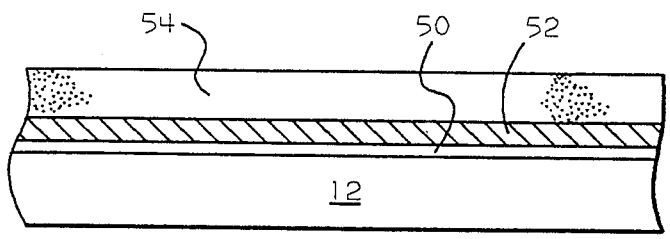

FIGS. 3A–3F illustrate a state-of-the-art pad structure built on substrate 12 consisting of a layer of silicon dioxide 50 and silicon nitride 52. Overlaying the layer 52 is deposited a polycrystalline or polysilicon layer 54 as shown in FIG. 3B, having a thickness in the range of 100 to 400 nms.

Figure 3C:
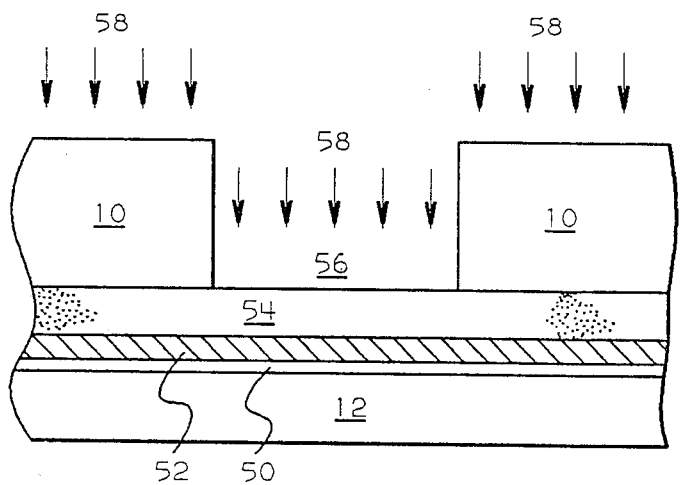
Figure 3D:
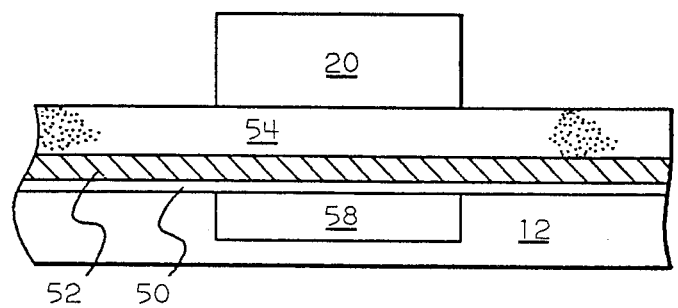

In FIG. 3C, the first masking step is exposed to a first photoresist layer 10 to define n-well region 56, followed by an n-well ion-implantation 58. The wafers now undergo the photoresist lift-off process in accordance with the teachings of this invention. The resulting structure is shown in FIG. 3D where the second layer of photoresist 20 occupies the n-well after having gone through a lift-off process.

Figure 3E:
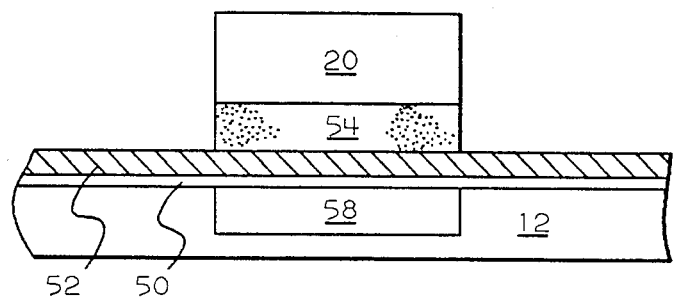
Figure 3F:
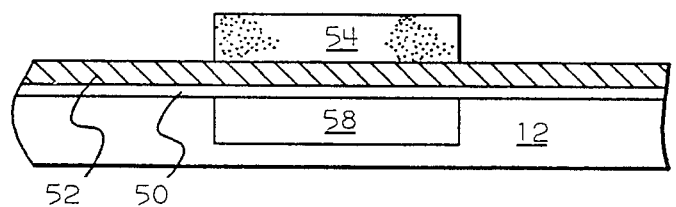

Referring to FIG. 3E, the exposed polysilicon layer 54 is next selectively etched out so that the region 58 is covered by both the polysilicon and photoresist. The second layer of photoresist is stripped off and the n-well is driven in to form the ion implant 58, as shown in FIG. 3F.

Note that this structure is similar to that state-of-the art described above for the CMOS pad structure, except that the evaporated silicon is replaced by the standard polysilicon layer. Additional prior art processing steps may be applied to complete the devices.

From the foregoing, it is evident that the large number of problems encountered with silicon lift-off for CMOS processing are overcome when photoresist lift-off is used. No special or unique materials or process tools are required. Processing time is reduced since applying photoresist is faster compared with silicon deposition. To employ the evaporator tool is a fairly complex and time consuming undertaking.

A simpler version of the CMOS process is also possible utilizing this invention. This version is one where the n-well is localized only in the area where the pMOS device is to be placed. Such a process may be used to build CMOS integrated circuits where either the pMOS devices are sparingly used, or only used, for example, in an array form.

Figure 4A:
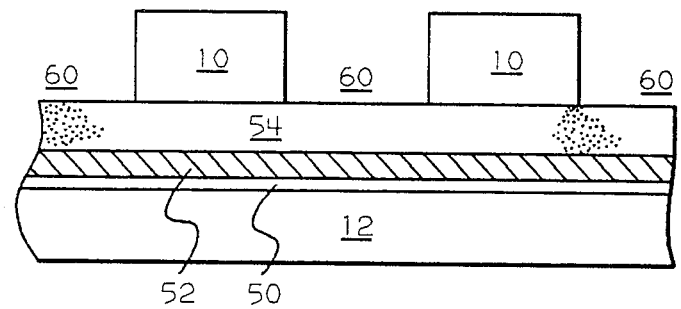
FIGS. 4A-4E are cross-sectional views showing how a CMOS semiconductor device can be fabricated to have a n-well, p-well and a field ion implantation regions employing the photoresist process of this invention.
Figure 4B:
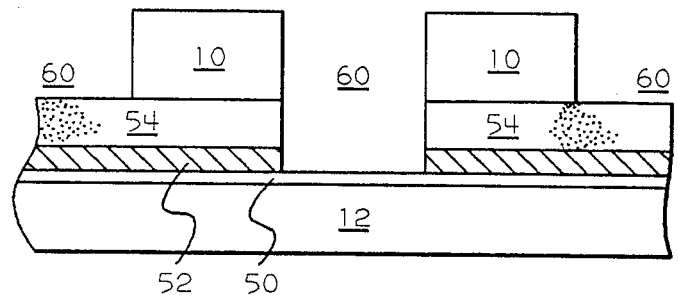

Referring to FIG. 4A, a cross-sectional view is shown of the wafer after the first photoresist layer 10 has been exposed to define p-field insulator regions 60. At this point, the polysilicon layer 54 and the pad nitride 52 are etched out as shown in FIG. 4B.

Figure 4C:
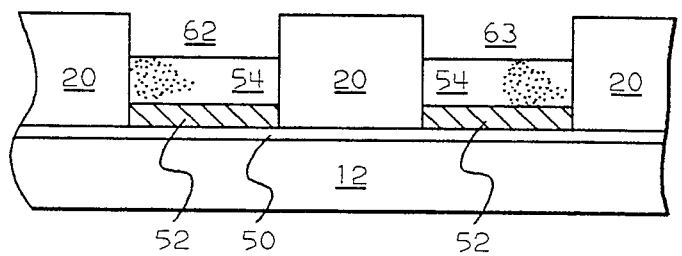

The photoresist patterns are reversed in accordance with the teachings of this invention. As shown in FIG. 4C, the second photoresist layer 20 now blocks out the field insulator regions 50. The thin pMOS and nMOS regions 62 and 63 respectively are exposed.

Figure 4D:
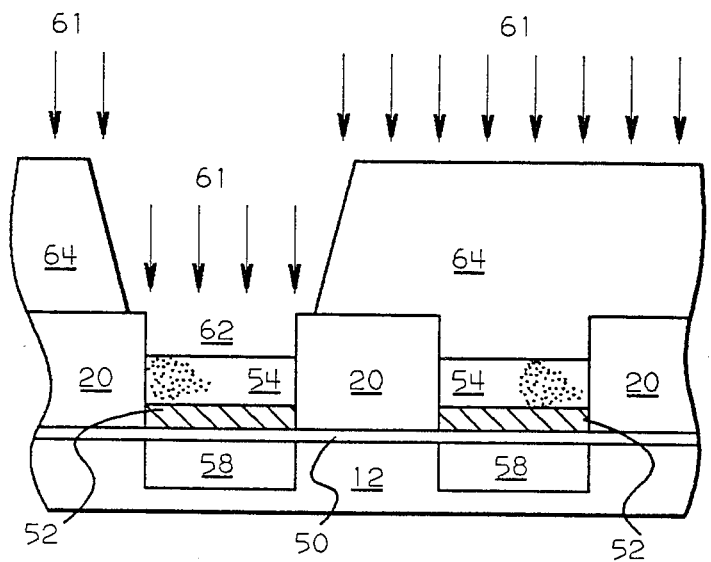

Illustrated in FIG. 4D is an n-well ion implantation step 61. If one desired to selectively ion implant the n-well area 62 with an additional ion implantation, this can be accomplished by a third photoresist 64. This step is non-critical to alignment because of the presence of the second photoresist layer 20 which has a thickness much greater than the exposed stack of insulators 50, 52, and 54. The ion-implant conditions are such that the dopant penetrates the aforementioned stack of insulators 50, 52 and 54 to form the n-well 58 in the substrate 12.

Figure 4E:
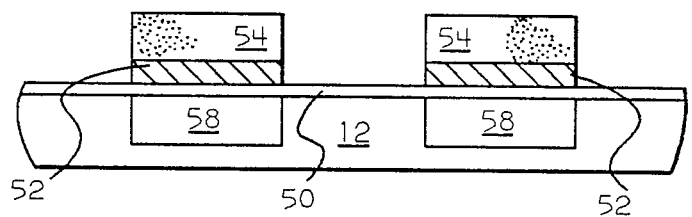

Next, the resist layer 64 and the second photoresist layer 20 are removed and the n-well is driven in. Following the normal state-of-the-art processes, the CMOS structure is completed, as shown in FIG. 4E.

Although the above preferred description refers to utilizing two positive photoresist steps, it is within the scope of this invention that a MIRP resist (Modified Image Reversal Process) can be substituted for the first positive resist layer and processed like a positive resist. Thus, the MIRP resist can be employed either as a positive or negative resist. Such an image reversal process is described in U.S. Pat. No. 4,104,070 to H. Moritz and G. Paal and assigned to the same assignee as this application. For example, such first MIRP photoresist can be positive or negative acting, depending on the process steps. For example, it can be made positive by including the steps of applying, baking, exposing and developing. The second photoresist of the same formulation as the first can be made negative by the steps of applying, baking, exposing, rebaking, and flood exposing prior to development.

Also, instead of employing diazo-novolak photoresist organic films acrylic materials such as polymethacrylate or copolymers or terpolymers of polymethacrylate and methacrylic acid can be used as the second masking level.

The above materials are only intended as illustrative as the kind of materials that may be used.

Although the method of exposure of the first layer was described as a photo-exposure using light, it is within the skill-of-the-art to use E-beam (with no mask) or ion beams (with no mask) or X-rays (using masks).

Although the above process is particularly useful in achieving acceptable submicron alignment, it can also achieve improved alignment for large density semiconductors.

Although a specific embodiment of the invention has been disclosed it will be understood by those of skill in the art that the foregoing and other changes in form and detail may be made therein without departing from the spirit and the scope of the invention.

We claim:

1. A photoresist lift-off process for fabricating semiconductor devices comprising the steps of:
   applying a first layer of positive photoresist on the surface of a semiconductor substrate;
   exposing said first photoresist layer to light through a mask having at least one aperture located where at least one hole is to be formed in said first photoresist layer;
   developing said exposed first photoresist layer to remove portions of said first photoresist layer, which are exposed to light to form at least one hole in said first photoresist layer where a first part of a device is to be formed;
   performing a first process step through said hole to form a first part of a device in said hole, said first process step selected from the group consisting of ion implantation, etching, and deposition;
   oxidizing the surface of said first layer;
   applying a second layer of negative photoresist containing imidazole which is at least light transmissive over the entire semiconductor device, parts of said second layer being disposed on said first layer and at least a part thereof being present within said hole;
   exposing the device, including said second layer and said remaining first layer to light;
   developing said first and second layers with a solvent to remove said first layer and overlying portions of said second layer, leaving portions of said second layer within said hole; and
   performing a second process step selected from the group consisting of ion implantation, etching and deposition to form a second part of the device on said exposed surface adjacent said hole;
   whereby said first and second parts are self-aligned.

2. A photoresist lift-off process for fabricating semiconductor devices comprising the steps of:
   applying a first layer of positive photoresist on the surface of a semiconductor substrate;

exposing said first photoresist layer to light through a mask having at least one aperture located where at least one hole is to be formed in said first photoresist layer;

developing said exposed first photoresist layer to remove portions of said first photoresist layer which are exposed to light to form at least one hole in said first photoresist layer where a first part of a device is to be formed, said hole having sidewall angles in the range 80 to 110 degrees;

performing a first process step through said hole to form a first part of a device in said hole, said first process step selected from the group consisting of ion implantation, etching, and deposition;

oxidizing the surface of said first layer;

applying a second layer of negative photoresist containing imidazole which is at least light transmissive over the entire semiconductor device, parts of said second layer being disposed on said first layer and at least a part thereof being present within said hole, the sidewall angles of said second layer being complementary to the hole in which it was deposited, the total angle being 180 degrees;

exposing the device, including said second layer and said remaining first layer to light;

developing said first and second layers with a solvent to remove said first layer and overlying portions of said second layer, leaving portions of said second layer within said hole; and performing a second process step selected from the group consisting of ion implantation, etching and deposition to form a second part of the device on said exposed surface adjacent said hole;

whereby said first and second parts are self-aligned.

3. The process of claim 1 wherein the first masking layer of photoresist is, diazo-novolak photoresist containing 0.5 to 5.0% by weight of imidazole, where such level is processed as a positive acting photoresist, and the second masking layer of photoresist is diazo-novolak photoresist containing 0.5 to 5.0% of imidazole additive.

* * * * *